Figure 1:
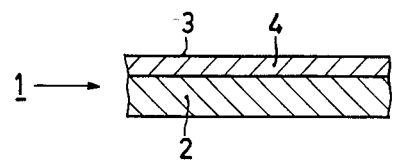

United States Patent [19]

Haisma et al.

[11] Patent Number: 4,554,030

[45] Date of Patent: Nov. 19, 1985

[54] METHOD OF MANUFACTURING A SEMICONDUCTOR DEVICE BY MEANS OF A MOLECULAR BEAM TECHNIQUE

[76] Inventors: Jan Haisma; Poul K. Larsen, both of Groenewoudseweg 1, Eindhoven; Tim De Jong, Gerstweg 2, Nijmegen; Johannes F. Van der Veen, Lothariuslaan 107, Bussum, all of Netherlands; Willem A. S. Douma, Private Bag 0022, Gaborono, Botswana; Frans W. Saris, Jennerstraat 1, Amsterdam, Netherlands

[21] Appl. No.: 585,649

[22] Filed: Mar. 2, 1984

[30] Foreign Application Priority Data

Mar. 3, 1983 [NL] Netherlands .......................... 8300780

[51] Int. Cl.[4] .................. H01L 21/203; H01L 21/324
[52] U.S. Cl. .................................. 148/175; 29/576 E; 29/576 T; 148/1.5; 148/174; 148/DIG. 3; 148/DIG. 7; 148/DIG. 25; 148/DIG. 123; 148/DIG. 169; 156/612; 156/DIG. 64; 156/DIG. 67; 156/DIG. 70; 156/DIG. 73
[58] Field of Search ........................ 148/1.5, 174, 175; 29/576 E, 576 T; 156/612, DIG. 64, DIG. 67, DIG. 70, DIG. 73

[56] References Cited

U.S. PATENT DOCUMENTS 3,988,172 10/1976 Bachmann et al. .............. 148/175 X
4,039,357 8/1977 Bachmann et al. ................. 148/175

FOREIGN PATENT DOCUMENTS 1270550 4/1972 United Kingdom .

OTHER PUBLICATIONS

Berkenblit et al., "Reduction of Stress in . . . Hetero--Epitaxial Layers", IBM Tech. Discl. Bull., vol. 12, No. 9, Feb. 1970, p. 1489.
Yagi et al., "Germanium and Silicon Film Growth . . . ", Jap. J. Appl. Physics, vol. 16, No. 2, Feb. 1977, pp. 245-251.
Greene et al., "Epitaxial Ge/GaAs Heterostructures . . . ", Appl. Phys. Lett., vol. 39, No. 3, Aug. 1, 1981, pp. 232-234.
Bhattacharyya et al., "Theoretical . . . Annealing of $\alpha$-Ge . . . on GaAs", J. Phys., D: Appl. Physics, 16, 1983, pp. 2033-2037.

Primary Examiner—William G. Saba
Attorney, Agent, or Firm—Paul R. Miller

[57] ABSTRACT

A monocrystalline layer of one semiconductor material is grown onto a surface of a monocrystalline semiconductor body by means of molecular beam epitaxy. During such growth, the semiconductor body is kept at such a low temperature that a non-monocrystalline layer is obtained. The non-monocrystalline layer is then converted by a heat treatment into a monocrystalline form. Accordingly, an abrupt junction between the two semiconductor materials is obtained.

4 Claims, 8 Drawing Figures

METHOD OF MANUFACTURING A SEMICONDUCTOR DEVICE BY MEANS OF A MOLECULAR BEAM TECHNIQUE

The invention relates to a method of manufacturing a semiconductor device, in which on a surface of a monocrystalline semiconductor body having a surface-adjacent region of a first semiconductor material, there is formed a monocrystalline layer of a second semiconductor material by means of a molecular beam technique with the second semiconductor material being deposited on the surface by a particle beam which comprises substantially only atoms or molecules or atoms and molecules of the second semiconductor material.

Such a method is particularly suitable for the manufacture of semiconductor devices having junctions between different semiconductor materials—so-called heterojunctions—of the kind occurring, for example, in laser diodes and in certain transistors.

From British patent specification No. 1,270,550 a method of the kind mentioned in the opening paragraph is known in which the second semiconductor material is a compound of elements from the groups III and V of the periodic system of elements. The first semiconductor material is, for example, silicon, germanium, gallium phosphide or gallium arsenide. Both semiconductor materials are chosen so that they have at least substantially equal lattice constants in monocrystalline form. During deposition of the second semiconductor material on the surface of the semiconductor body, the latter is kept at such a temperature that a monocrystalline layer is formed.

A disadvantage of the known method described is that a monocrystalline layer of the second semiconductor material is formed, which can contain a large number of atoms of the first semiconductor material. Moreover, a non-abrupt junction can be formed between the two semiconductor materials as a result of exchange of atoms of both semiconductor materials during deposition of the monocrystalline layer.

The invention has inter alia for its object to provide a method by which a semiconductor device can be manufactured which has a comparatively abrupt junction between the two semiconductor materials, while the monocrystalline layer formed contains a comparatively small number of atoms of the first semiconductor material.

According to the invention, the method mentioned in the opening paragraph is therefore characterized in that during deposition of the second semiconductor material the semiconductor body is kept at such a temperature that a non-monocrystalline layer is formed, which is then converted by a heat treatment into a monocrystalline form.

The invention is based on the recognition of the fact that the desired semiconductor device can be obtained by forming the monocrystalline layer by means of an operation which is carried out in two steps.

During the first step the temperature of the semiconductor body is adjusted so that a non-crystalline layer is formed. This temperature can be so low that during deposition of the second semiconductor material substantially no exchange of atoms of the two semiconductor materials occurs. The non-monocrystalline layer thus formed contains a comparatively small number of atoms of the first semiconductor material, while there is a comparatively abrupt junction between the two materials. During the second step the non-monocrystalline layer is converted by a heat treatment into a monocrystalline form. In this heat treatment, the semiconductor body need to be heated for such a short time at only such a low temperature that substantially no diffusion of atoms of the first semiconductor material into the second semiconductor material (and conversely) occurs. Thus, the desired semiconductor device is obtained.

A preferred embodiment of the method according to the invention is characterized in that the first semiconductor material is a compound of elements from groups III and V of the periodic system of elements and the second semiconductor material is an element from group IV of the periodic system of elements.

In this case—as compared with the known described method—a very abrupt junction can be formed and a very clean monocrystalline layer is obtained. Elements from groups III and V of the periodic system of elements are used as dopants in semiconductor bodies of elements from group IV of the periodic system of elements and are soluble therein up to high concentrations. With the use of the known method described, a very strongly doped monocrystalline layer is formed, while the junction is anything but abrupt. On the contrary, with the method according to the invention considerably cleaner layers and considerably more abrupt junctions can be obtained. This is the case especially when the first semiconductor material is gallium phosphide and the second semiconductor material is silicon or when the first semiconductor material is gallium arsenide and as the second semiconductor material is germanium.

A very practical embodiment of the method according to the invention is characterized in that during deposition of the second semiconductor material the semiconductor body is kept at a temperature below 100° C. and in that the non-monocrystalline layer obtained is converted into a monocrystalline form by heating at a temperature from 450° to 650° C.

Figure 2:
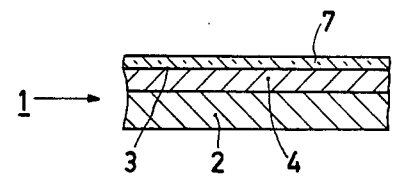
Figure 3:
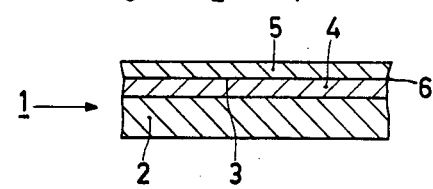
Figure 4:
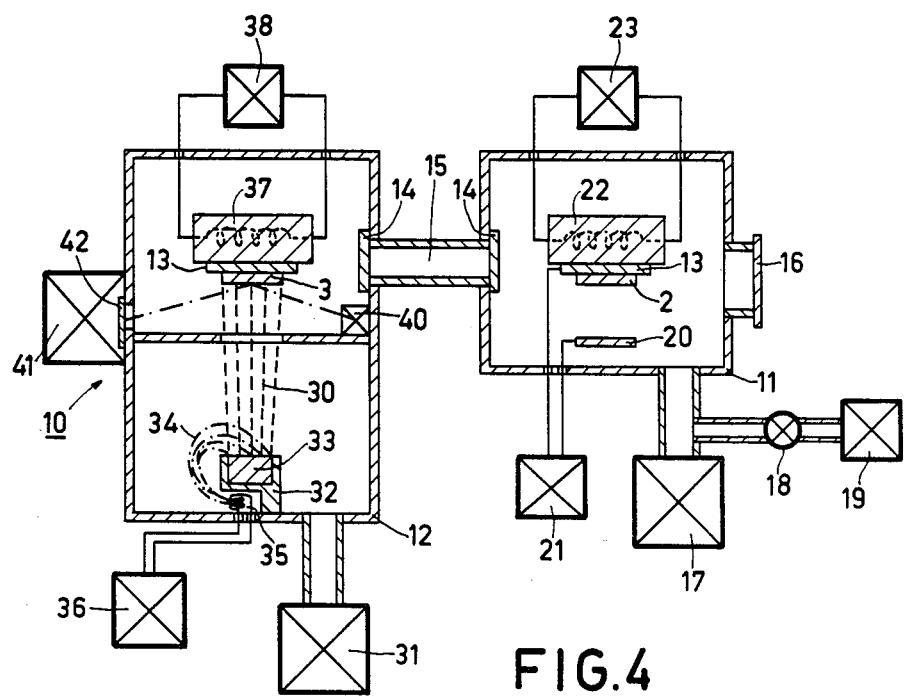
Figure 5:
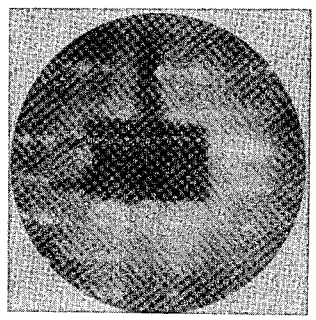
Figure 6:
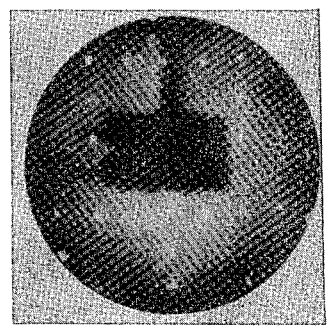
Figure 7:
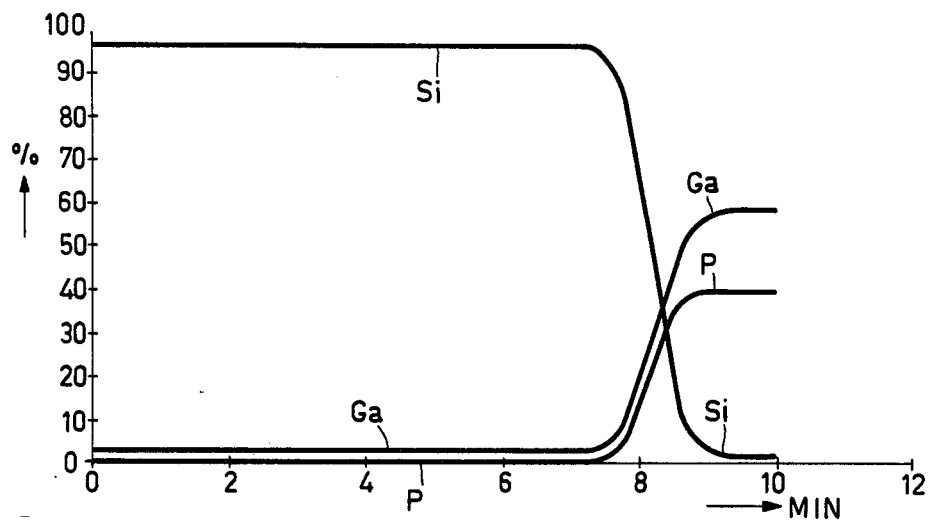
Figure 8:
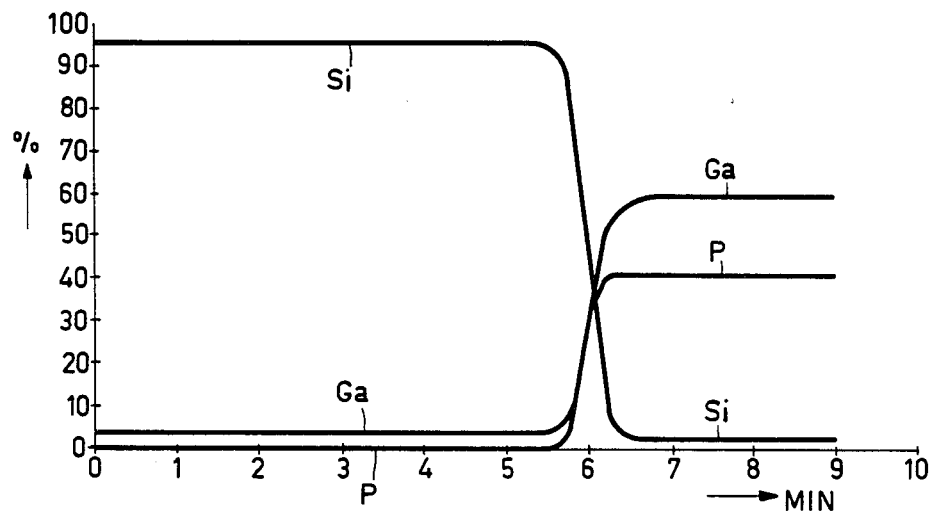

The invention will now be described more fully, by way of example, with reference to drawings and with reference to a few embodiments. In the drawings:

FIGS. 1 to 3 show a few stages of the manufacture of a semiconductor device by means of a method according to the invention, FIG. 4 shows diagrammatically an arrangement for carrying out the method according to the invention, FIGS. 5 and 6 show LEED exposures of the substrate body before and during the growth of silicon respectively, FIG. 7 shows relative concentrations of silicon, gallium and phosphorus in a layer grown by a prior art method, and FIG. 8 shows relative concentrations of silicon, gallium and phosphorus in a layer grown by a method according to the invention.

FIGS. 1 to 3 show a few stages of the manufacture of a semiconductor device 1 by means of a method according to the invention, in which on a surface 3 of a monocrystalline semiconductor body 2, whose region adjoining this surface 3 consists of a first semiconductor material, there is formed a monocrystalline layer 5 of a second semiconductor material. In the embodiment, the first semiconductor material constitutes a surface zone 4, but this is not essential to the invention; the whole semiconductor body is also allowed to consist of the same material.

Between the surface zone 4 and the monocrystalline layer 5 there is formed a so-called heterojunction 6, such as occurs, for example, in laser diodes and a certain transistors.

The monocrystalline layer 5 is formed by means of a molecular beam technique which can be carried out in an arrangement 10 shown diagrammatically in FIG. 4. This arrangement comprises two vacuum chambers 11 and 12, in which a substrate holder 13 can be arranged, on which the semiconductor body 2 can be secured. The substrate holder 13 can be displaced via an air-lock 15, which can be closed by valves 14, from one vacuum chamber 11 (12) to the other vacuum chamber 12 (11), the vacuum in both chambers 11 and 12 remaining substantially unchanged.

After the substrate holder 13 with the semiconductor body 2 mounted on it has been introduced via a door 16 into the vacuum chamber 11, a low pressure is produced therein by means of a pump 17. After a small quantity of argon has then been admitted through a cock 18 from a supply vessel 19, the semiconductor body 2 is sputtered to cleanness by applying in a conventional manner a suitable voltage between the substrate holder 13 and an electrode 20 by means of a voltage source 21. Subsequently, the cleaned semiconductor body 2 is heated for some time by means of a heating element 22, which is supplied from a supply source 23. Due to this heat treatment, damage of the surface 3 of the semiconductor body 2 is repaired so that a monocrystalline layer 4 is exposed.

After this sputtering treatment, the substrate holder 13 with the semiconductor body 2 is transported via the air-lock 15 to the vacuum chamber 12, in which the second semiconductor material is deposited on the surface 3 of the semiconductor body 2. For this purpose, this surface 3 is arranged in a particle beam 30 which comprises substantially only atoms or molecules or atoms and molecules of the second semiconductor material. This particle beam 30 is produced by evaporating a quantity of the second semiconductor material 33 arranged in a container 32 in the vacuum chamber 12 brought by means of a pump 31 to a pressure below $10^{-8}$ Torr. The material 33 is heated by means of an electron beam 34, which is generated in a conventional manner by an electron source 35, which is supplied from a source of supply 36. Thus, a beam of atoms or a beam of molecules is formed. Further, for producing a particle beam use may be made of a Knudsen cell, which will not be described more fully, but which is conventional to this kind of technique.

The substrate holder 13 can be kept at a desired temperature by means of a heating element 37 and an associated supply unit 38. During deposition of the second semiconductor material on the surface 3 of the semiconductor body 2, the latter is held at such a temperature that a non-monocrystalline layer 7 is obtained (FIG. 2), which—after the particle beam 30 has been switched off—is converted by a heat treatment by means of the heating element 37 into a monocrystalline form. The monocrystalline layer 5 thus formed contains a comparatively small number of atoms of the first semiconductor material and the heterojunction 6 between the layers 4 and 5 is comparatively abrupt. During deposition of the layer 7, the temperature of the semiconductor body 2 can be so low that substantially no exchange of atoms of the two semiconductor materials occurs near the surface 3. The non-monocrystalline layer 7 is therefore substantially free from atoms of the first semiconductor material. During the next heat treatment, the temperature can remain so low that also substantially no diffusion of atoms from the layer 4 into the layer 5 occurs. The monocrystalline layer 5 therefore also comprises substantially no atoms of the first semiconductor material and the heterojunction 6 is abrupt.

During the process of growing the layer 5,7 onto the substrate surface 3, the surface structure of the layer than grown can be monitored by means of LEED (Low Energy Electron Diffraction) exposures. The arrangement for this purpose comprises an electron gun 40 and a camera 41 having a fluorescent screen 42, of which a photograph can be taken.

Although elements from groups III and V of the periodic system of elements are soluble up to high concentrations in semiconductor bodies manufactured from elements from group IV of the periodic system, the method described yields very satisfactory results if the first semiconductor material is a compound of elements from the groups III and V of the periodic system of elements and the second semiconductor material is an element from group IV of the periodic system of elements. The layer 5 made of an element from group IV then contains a very small number of atoms from groups III and V and also in this delicate case the heterojunction 6 is abrupt.

After the monocrystalline layer 5 has been formed, the latter may be made thicker by again switching on the particle beam 30. The temperature of the semiconductor body 2 can now be adjusted again so that a non-monocrystalline layer is obtained (which is then converted by a heat treatment into a monocrystalline form), but it is alternatively possible that the temperature is adjusted so that a monocrystalline layer is obtained immediately. Further is is possible to form on the monocrystalline layer 5 a monocrystalline layer of another semiconductor material by means of the molecular beam technique described above. This other material may then be, for example, again the first semiconductor material. When the last-mentioned method is repeated, a superlattice structure can be formed if successive layers are sufficiently thin.

EXAMPLE I

In this example, a wafer of (100) oriented gallium phosphide was used as the semiconductor body. This wafer was sputtered to cleanness with argon and was then annealed at a temperature of approximately 550° C. for about 1 hour. FIG. 5 shows a (4×2) LEED pattern made from this surface; the surface-adjacent layer is monocrystalline.

Subsequently, silicon as grown at a pressure of approximately $10^{-8}$ Pa and at rate of 0.1 nm/sec, the slice of gallium phosphide being kept at a temperature of 550° C. FIG. 6 shows a (2×1) LEED pattern after approximately 0.8 nm of silicon has grown; this pattern remains unchanged during the further growth process. It appears from these LEED exposures taken during the growth process that a monocrystalline silicon layer is formed.

After an approximately 500 nm thick silicon layer had grown, the growth process was terminated.

Subsequently, the composition of the layer thus grown was determined by means of Auger spectroscopy. By means of an electron beam having a cross-section of 2×3 μm and an energy of 3 kV, the grown layer was removed by sputtering. During this removal Auger spectra were measured, after which the relative concentrations of silicon, gallium and phosphorus were determined by a comparison of peak heights in these spectra. FIG. 7 shows these relative concentrations as a function of the sputtering time. In this case, approximately 20 nm/min was removed by sputtering. At the instant "0" on the time axis, a large part of the layer had already been removed. It appears from this graph that the junction between silicon and gallium phosphide has a width of approximately 20 nm.

EXAMPLE II

In this example, a slice of gallium phosphide was used which was cleaned in the same manner as in the preceding example.

Silicon was grown onto this slice at a pressure of approximately $10^{-8}$ Pa and at a rate of 0.1 nm/sec. The slice of gallium phosphide was kept at room temperature during the growth process. It appears from LEED exposures taken during the growing process that a non-monocrystalline layer is formed. The LEED exposures taken during the growth process in this case show no structure at all.

After an approximately 100 nm thick silicon layer had grown, the growth process was terminated and the slice was heated to a temperature of approximately 550° C. After approximately 2 hours, the LEED exposures again had the structure shown in FIG. 6; after this heat treatment the layer was monocrystalline.

In the same manner as in the preceding example, the composition of the grown layer also in this case was measured by means of Auger spectroscopy. FIG. 8 shows for this layer the relative composition. It appears from FIG. 8 that by the use of the method according to the invention the width of the junction between silicon and gallium phosphide is considerably smaller than in the preceding example. In this case, the width is approximately 5 nm.

The concentrations of gallium and phosphorus in the silicon layer and that of silicon in the gallium phosphide, which are indicated in FIGS. 7 and 8, are to be interpreted as noise. Lower concentrations cannot be determined by this method.

It will be appreciated that the method according to the invention is suitable not only for growing a silicon layer onto a gallium phosphide substrate, but generally also for growing elements onto substrates comprising substances which are readily soluble in the element to be grown. For example, the method is particularly suitable for growing a monocrystalline germanium layer onto a monocrystalline gallium arsenide substrate.

What is claimed is:

1. A method of manufacturing a semiconductor device comprising the steps of
   providing a first monocrystalline semiconductor layer of a first material having a surface region,
   forming a second semiconductor layer of a second material onto said surface region of said first layer by a molecular beam particle deposition technique, said second layer being formed at a first temperature providing a non-monocrystalline semiconductor layer, said molecular beam particle deposition technique forming a particle beam of at least one of atoms and molecules of said second semiconductor layer, and thereafter
   heating said non-monocrystalline semiconductor layer to a second temperature for converting said non-monocrystalline semiconductor layer into a monocrystalline semiconductor layer.

2. A method according to claim 1, wherein said first semiconductor layer is a material of group III-V of the periodic system of elements, and wherein said second semiconductor layer is a material of group IV of the periodic system of elements.

3. A method according to claim 2, wherein said first semiconductor layer is gallium phosphide and said second semiconductor layer is silicon.

4. A method according to claim 3, wherein during deposition of said second layer, said first temperature is maintained below 100° C., and wherein said second temperature is provided within a range between 450° to 650° C.

* * * * *